US009349753B2

(12) United States Patent
Cai et al.

(10) Patent No.: US 9,349,753 B2
(45) Date of Patent: May 24, 2016

(54) ARRAY SUBSTRATE, METHOD FOR PRODUCING THE SAME AND DISPLAY APPARATUS

(71) Applicants: BOE Technology Group Co., Ltd., Beijing (CN); Hefei Xinsheng Optoelectronics Technology Co., Ltd., Anhui (CN)

(72) Inventors: Zhenfei Cai, Beijing (CN); Zhengwei Chen, Beijing (CN)

(73) Assignees: BOE Technology Group Co., Ltd., Beijing (CN); Hefei Xinsheng Optoelectronics Technology Co., Ltd., Anhui (CN)

( * ) Notice: Subject to any disclaimer, the term of this patent is extended or adjusted under 35 U.S.C. 154(b) by 0 days.

(21) Appl. No.: 14/312,092

(22) Filed: Jun. 23, 2014

(65) Prior Publication Data
US 2015/0240350 A1    Aug. 27, 2015

(30) Foreign Application Priority Data
Feb. 24, 2014    (CN) .......................... 2014 1 0062665

(51) Int. Cl.
C23C 14/35    (2006.01)
H01L 27/12    (2006.01)

(52) U.S. Cl.
CPC ............ H01L 27/124 (2013.01); C23C 14/352 (2013.01)

(58) Field of Classification Search
CPC ............ G02F 1/1339; G02F 1/136204; G02F 1/134363; G02F 1/13394; C23C 14/3407; C23C 14/35; C23C 14/351
See application file for complete search history.

(56) References Cited

U.S. PATENT DOCUMENTS

| 2002/0057407 A1 | 5/2002 | Yamaguchi et al. | |
| 2002/0176045 A1* | 11/2002 | Song | G02F 1/13452 349/149 |
| 2005/0264749 A1* | 12/2005 | Lee | G02F 1/1333 349/156 |
| 2009/0168007 A1* | 7/2009 | Chung | G02F 1/13394 349/157 |
| 2010/0165278 A1* | 7/2010 | Matsumori | G02F 1/13394 349/123 |

(Continued)

FOREIGN PATENT DOCUMENTS

| CN | 102645788 A | 8/2012 |
| JP | 9-274194 A | 10/1997 |
| JP | 2012-189856 A | 10/2012 |

OTHER PUBLICATIONS

First Office Action, including Search Report, for Chinese Patent Application No. 201410062665.5, dated Jan. 12, 2016, 12 pages.

Primary Examiner — Jae Lee
Assistant Examiner — Mohammed R Alam
(74) Attorney, Agent, or Firm — Westman, Champlin & Koehler, P.A.

(57) ABSTRACT

An array substrate comprising display areas and non-display areas is provided. The non-display area comprises an area in which a plurality of gate lines and a plurality of data lines crossed to each other are located and an area in which thin film transistors are located, the gate lines and the data lines being formed by patterning metal film layers which are formed in the area by magnetron sputtering targets spaced to each other; and wherein a pad part is formed in an area of the non-display areas corresponding to the spacing areas between the targets, a sum of thickness of the metal film layer foamed in the areas corresponding to the spacing areas between the targets and the thickness of the pad part being equal to the thickness of the metal film layer formed in the areas facing the targets.

7 Claims, 3 Drawing Sheets

(56) References Cited

U.S. PATENT DOCUMENTS

| | | | | |
|---|---|---|---|---|
| 2011/0058136 A1* | 3/2011 | Chang | ................ | G02F 1/13394 349/155 |
| 2012/0104404 A1* | 5/2012 | Kwack | ................ | H01L 27/1288 257/72 |
| 2013/0155367 A1* | 6/2013 | Tomioka | ................ | G02F 1/1339 349/155 |
| 2013/0162939 A1* | 6/2013 | Kobayashi | .......... | G02F 1/13394 349/155 |
| 2014/0175467 A1* | 6/2014 | Choi | ................ | G02F 1/134363 257/89 |

* cited by examiner

ARRAY SUBSTRATE, METHOD FOR PRODUCING THE SAME AND DISPLAY APPARATUS

CROSS-REFERENCE TO RELATED APPLICATION

This application claims the benefit of Chinese Patent Application No. 201410062665.5 filed on Feb. 24, 2014 in the State Intellectual Property Office of China, the whole disclosure of which is incorporated herein by reference.

BACKGROUND OF THE INVENTION

1. Field of the Invention

The present disclosure relates to a technical field of display, more particularly, relates to an array substrate, a method for producing the same and a display apparatus.

2. Description of the Related Art

TFT-LCD (thin film transistor liquid crystal display) is composed of an array substrate and a color film substrate. Liquid crystal is filled between the array substrate and the color film substrate opposed to each other to form a liquid crystal box. By means of controlling the deflection of the liquid crystal, the intensity of the light will be controlled and then the color image display may be achieve by filtering effects of the color film substrate. It typically needs to provide a plurality of spacers between the array substrate and the color film substrate to support the thickness of the liquid crystal box.

In the conventional process of producing the array substrate, it needs to deposit metal film layers 10 (such as a gate metal layer, a source and drain metal layer) on a transparent substrate 100 by magnetron sputtering In particular, the plurality of targets 12 for forming the metal film layers are spaced to each other, as illustrated in FIG. 1, then the spaced targets are magnetron sputtered to form the metal film layers 10 on the transparent substrate 100, such that the utilization ratio of the targets can be improved. However, there is a spacing area 120 between two adjacent targets, the metal film layers 10 formed on the transparent substrate 100 in the spacing area 120 has a thickness which is less than that of the metal film layers 10 formed in the area 121 facing the target. Thus, the formed metal film layers 10 may be uneven. In this way, the flatness of the surface of the film layer at the interface between a surface of the metal film layers 10 and the spacers so as to cause non-uniformity in height among the plurality of spacers on the array substrate, for example, the height of the metal film layers 10 on the transparent substrate 100 corresponding to the target spacing area 120 may be lower than a normal value such that the spacers thereon cannot have a support function, thereby generating negative phenomenon such as display failure and degrading the quality of products seriously.

SUMMARY OF THE INVENTION

In view of the above and other problems in the prior art, the embodiments of the present invention provide an array substrate, a method for producing the same and a display apparatus, which can achieve uniformity in thickness of the film layers in contact with the spacers.

In order to solve the above technical problem, an embodiment of the present invention provides an array substrate comprising display areas and non-display areas, wherein the non-display area comprises an area in which a plurality rows of gate lines and a plurality columns of data lines crossed to each other are located and an area in which thin film transistors are located, the gate lines and the data lines being formed by patterning metal film layers which are formed by magnetron sputtering targets spaced to each other; and wherein a pad part is formed in an area of the non-display areas corresponding to the spacing areas each between the targets, a sum of thickness of the metal film layers formed in the areas corresponding to the spacing areas between the targets and the thickness of the pad part being equal to the thickness of the metal film layer formed in the areas facing the targets.

An embodiment of the present invention provides a method for producing an array substrate, the array substrate comprising display areas and non-display areas, the method comprising: magnetron sputtering targets spaced to each other to form metal film layers and patterning the metal film layers to form a plurality rows of gate lines and a plurality of columns data lines crossed to each other in the non-display area and forming thin film transistors, wherein the method further comprises: forming a pad part in an area of the non-display areas corresponding to the spacing areas each between the targets, a sum of thickness of the metal film layers formed in the areas corresponding to the spacing areas between the targets and the thickness of the pad part being equal to the thickness of the metal film layers formed in the areas facing the targets.

BRIEF DESCRIPTION OF THE DRAWINGS

The above and other features of the present invention will become more apparent by describing in detail exemplary embodiments thereof with reference to the accompanying drawings, in which.

DETAILED DESCRIPTION OF PREFERRED EMBODIMENTS OF THE INVENTION

Figure 1:
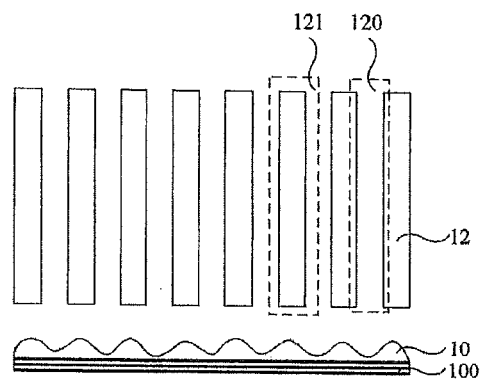
FIG. 1 is a schematic view showing a magnetron sputtering method in the prior art.

The embodiments of the present invention will be further explained below with reference to the figures and examples. The following embodiments are only explained by way of examples, instead of being intended to limit the scope of the present invention. In accordance with a general invention concept of the present disclosure, an array substrate is provided, comprising display areas and non-display areas, wherein the non-display area comprises the areas in which a plurality rows of gate lines and a plurality columns of data lines crossed to each other are located and the areas in which thin film transistors are located, the gate lines and the data lines being formed by patterning metal film layers which are formed by magnetron sputtering targets spaced to each other;

and wherein a pad part is formed in an area of the non-display areas corresponding to the spacing areas each between the targets, a sum of thickness of the metal film layers formed in the areas corresponding to the spacing areas between the targets and the thickness of the pad part being equal to the thickness of the metal film layer formed in the areas facing the targets.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

Figure 2:
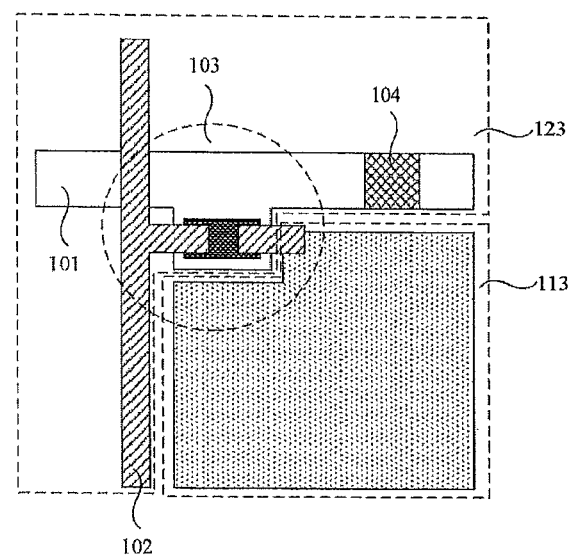
FIG. 2 is a schematic view showing a structure of an array substrate according to an exemplified embodiment of the present invention.

An embodiment of the present invention provides an array substrate. FIG. 2 is a schematic view showing a structure of an array substrate according to an exemplified embodiment of the present invention. As shown in FIG. 2, the array substrate includes display areas 113 and non-display areas 123. The non-display areas 123 comprise the areas in which a plurality rows of gate lines 101 and a plurality columns of data lines 102 crossed to each other are located and the areas in which thin film transistors (TFT) 103 are located. The gate lines 101 and the data lines 102 are formed by patterning metal film layers which are formed by magnetron sputtering targets 12 spaced to each other.

A pad part 104 is formed in an area of the non-display areas 123 corresponding to the spacing areas 120 between the targets 12. And a sum of thickness of the metal film layers 10 formed in the areas corresponding to the spacing areas 120 between the targets 12 and the thickness of the pad part 104 is equal to the thickness of the metal film layers 10 formed in the areas 121 facing the targets 12.

It should be noted that, in order to improve utilization ratio, the above targets 12 are arranged and spaced to each other. The metal film layers 10 are deposited on the transparent substrate 100 by the magnetron sputtering process. The thickness of the metal film layers 10 formed in the areas corresponding to the spacing areas 120 between the targets 12 is less than the thickness of the metal film layers 10 formed in the areas 121 facing the targets 12. In this way, the resultant metal film layers 10 may be uneven such that the flatness of a surface of the film layer formed on the surface of the metal film layers 10 in contact with the spacers (not shown in Figs.) will be reduced. Thus, part of spacers on the array substrate will not have a function of supporting the liquid crystal box in thickness. With the above pad part 104 provided on the non-display areas 123, the thickness of the metal film layers 10 formed in the areas corresponding to the spacing areas 120 between the targets 12 may be increased such that the sum of thickness of the metal film layers 10 formed in the areas corresponding to the spacing areas 120 between the targets 12 and the thickness of the pad part 104 is equal to the thickness of the metal film layers 10 formed in the areas corresponding to the areas 121 facing the targets 12. In this way, the thickness of the film layer formed on the surface of the metal film layers 10 in contact with the spacers becomes uniform, such that each of spacers on the array substrate supports the liquid crystal box in thickness. Thus, the balance of the box thickness can be maintained and the quality of the products can be improved.

Figure 3:
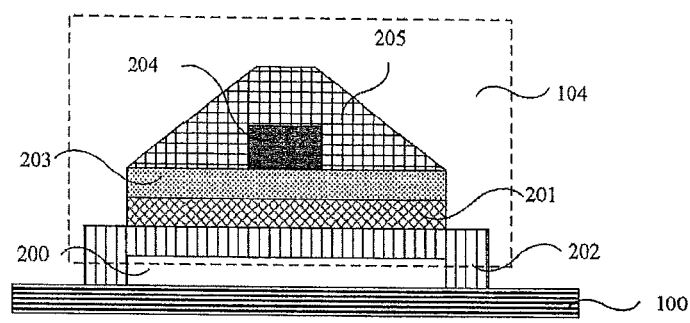
FIG. 3 is a schematic view showing a structure of a pad part according to an exemplified embodiment of the present invention.

Further, FIG. 3 is a schematic view showing a structure of a pad part according to an exemplified embodiment of the present invention. As shown in FIG. 3, the metal film layers 10 may comprise a gate metal layer 200 on a surface of the transparent substrate 100.

It should be noted that there are various metal film layers 10 on the array substrate, for example, the gate metal layer 200 forming the gate lines 101 and a source and drain metal layer forming the source and drain of TFT 103. For the TN (twist nematic) type display apparatus in which a common electrode is provided on the color film substrate, the gate metal layer 200 which may be used as the first metal film layer on the array substrate is located on the surface of the transparent substrate 100. Thus, it needs to provide a pad part 104 on the surface of the gate metal layer 200 to increase the thickness of the gate metal layer 200 formed in the areas corresponding to the spacing areas 120 between the targets. It can achieve uniformity in thickness of the film layer formed on the surface of the gate metal layer 200 in contact with the spacers and may improve quality of the array substrate.

In the example, the TN type display apparatus is a liquid crystal display in a principle of vertical electrical field. In the TN type display apparatus, the liquid crystal in the twist nematic mode is driven by forming a vertical electrical field between the common electrode on the color film substrate and the pixel electrode on the array substrate opposed to each other. The vertical electrical field liquid crystal display has an advantage of large aperture ratio, but has a shortcoming of narrow visual angle of about 90 degrees.

Further, the pad part 104 may comprise a rising layer 201, and the material from which the rising layer 201 is made is same to the material of a semiconductor active layer of TFT. The semiconductor active layer of TFT may be comprised of IGZO(indium gallium zinc oxide) in the same layer. In this way, the semiconductor active layer of TFT may be formed while the rising layer 201 is formed by a patterning process. Thus, the process of producing the pad part 104 comprising the rising layer 201 separately can be omitted such that the producing process may be simplified to improve the product efficiency.

It should be noted that in the present disclosure, the patterning process may comprise a lithographic process, or comprise both the lithographic process and an etching step, and may further comprise other process for forming predetermined patterns, for example, printing, ink-jetting processes. The lithographic process means a process that comprises such as film forming, exposing and developing and forms patterns by such as photoresist, a mask and an exposing device. The patterning process may be selected correspondingly depending on the structures formed in the present disclosure.

Further, as illustrated in FIG. 3, the pad part 104 may further comprise:

a trapezoid stack comprised of a first insulation layer 202, an etching protection layer 203, a source and drain metal layer 204 and a second insulation layer 205 formed sequentially from a surface of the gate metal layer 200 in the non-display areas 123. The trapezoid stack means the stack comprised of a plurality of film layers with areas reduced progressively formed on the surface of the gate insulation layer 200, as shown in FIG. 3. The film layer (the first insulation layer 202) closest to the gate insulation layer 200 has a maximum area while the film layer (the second insulation layer 205) farthest from the gate insulation layer 200 has a minimum area. In this way, the pad part 104 formed with small upper portion and large lower portion, may improve the stability of supporting the liquid crystal box by the spacers when the pad part 104 contacts with the spacers.

In this way, besides the above rising layer 201, the pad part 104 further has other film layers for forming the array substrate. The thickness of the gate insulation layer 200 formed in the areas corresponding to the spacing areas 120 between the targets 12 is increased due to the above rising layer 201. Thus, the film layer formed in the areas corresponding to the spacing areas 120 between the targets 12 in contact with the spacers and the film layer formed in the area corresponding to the areas 121 for facing the targets 12 in contact with the spacers have a substantially same thickness so as to improve the uniformity in thickness of the film layer at the interface between the spacers and the film layer. In this way, each of the spacers on the array substrate supports the liquid crystal box in thickness to keep the balance of box thickness to improve the quality of products.

It should be noted that the array substrate according to the embodiments of the present invention may also be used in FSS(fringe field switching) type liquid crystal display.

Figure 4:
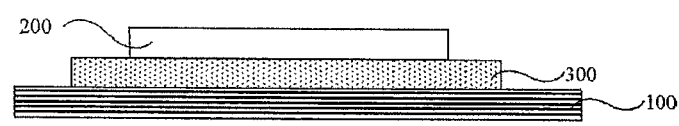
FIG. 4 is a schematic view showing a structure of another pad part according to an exemplified embodiment of the present invention.

FIG. 4 is a schematic view showing a structure of another pad part according to an exemplified embodiment of the present invention. As illustrated in FIG. 4, the pad part 104 may further comprise:

a first electrode layer 300 between the transparent substrate 100 and the gate metal layer 200 in the non-display areas 123. For the FFS type display apparatus in which the first electrode layer and the second electrode layer are both arranged on the array substrate, the gate metal layer 200 as the first one of the metal film layers on the array substrate is located on the surface of the first electrode layer 300. Thus, in order to keep uniformity in thickness of the film layer formed on the surface of the gate metal layer 200 in contact with the spacers, a pad part 104 comprising the first electrode layer 300 may be formed between the transparent substrate 100 and the gate metal layer 200 formed in the areas corresponding to the spacing areas 120 between the targets 12 so as to increase the thickness of the gate metal layer 200 formed in the areas corresponding to the spacing areas 120 between the targets 12 to keep uniformity in thickness of the film layer formed on the surface of the gate metal layer 200 in contact with the spacers. It may further improve the quality of the array substrate.

FFS technology forms multi-dimensional electrical fields by parallel electrical fields produced by the edge of the pixel electrodes in one same plane and the longitudinal electrical field produced between the pixel electrode layer and the common electrode layer. In this way, all liquid crystal molecules with all of orientations among the pixel electrodes above the electrodes in the liquid crystal box may produce rotational conversion so as to improve the work efficiency of the liquid crystal with plane orientation and improve the light transmission efficiency.

Figure 5:
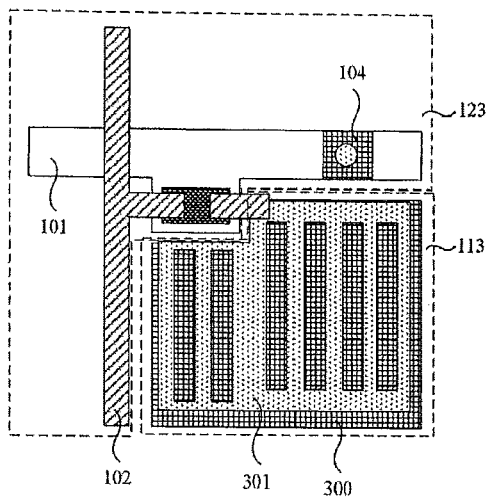
FIG. 5 is a schematic view showing a structure of another array substrate according to an exemplified embodiment of the present invention.

In order to further improve the uniformity in thickness of the film layer on the array substrate in contact with the spacers, FIG. 5 is a schematic view showing a structure of another array substrate according to an exemplified embodiment of the present invention. As illustrated in FIG. 5, the pad part 104 may further comprise:

a second electrode layer 301 on a surface of the second insulation layer 205 in the non-display areas 123. In this way, within the non-display areas 123, at the position of the film metal layers formed in the areas corresponding to the spacing areas 120 between the targets 12, by means of the pad part 104 comprising the first electrode layer 300, the rising layer 203 and the second electrode layer 301, the sum of the thickness of the metal film layers formed in the areas corresponding to the spacing areas 120 between the targets 12 and the thickness of the pad part 104 is equal to the thickness of the metal film layers formed in the areas corresponding to the areas 121 facing the targets 12, so at to achieve uniformity in thickness of the film layer on the array substrate in contact with the spacers. In this way, each of the spacers on the array substrate supports the liquid crystal box in thickness to keep the balance of box thickness to improve the quality of products.

Further, the first electrode layer 300 may be a common electrode and the second electrode layer 301 may be a pixel electrode; or the first electrode layer 300 may be a pixel electrode and the second electrode layer 301 may be a common electrode.

It should be noted that in the array substrate of the FFS type display apparatus, the common electrode and the pixel electrode may be provided in different layers respectively. The electrodes on the upper layer comprise a plurality of slit type electrodes and the electrodes on the lower layer comprise a plurality of slit type electrodes or are plate-like electrodes.

The term of "provided in different layers respectively" is referred to at least two kinds of patterns. "At least two kinds of patterns provided in different layers respectively" means the at least two kinds of patterns are formed by at least two film layers by means of a patterning process. "Two kinds of patterns provided in different layers respectively" means two film layers form one kind of pattern respectively by means of a patterning process. For example, "the common electrode and the pixel electrode provided in different layers respectively" means that the lower electrode is formed by the first transparent electrode film layer by means of the patterning process while the upper electrode is formed by the second transparent electrode film layer by means of the patterning process. In this example, the lower electrode is the common electrode (or the pixel electrode) and the upper electrode is the pixel electrode (or the common electrode). As illustrated in FIG. 5, the upper electrode is a slit pixel electrode while the lower electrode is a plate-like common electrode.

An embodiment of the present invention provides a display apparatus comprising any one of the array substrates described above, and has the same advantages as the array substrate in the above embodiments of the present invention. Since the array substrate has been explained specifically in the above embodiments, their specific description will be omitted.

In the embodiment of the present invention, the display apparatus may comprise liquid display apparatus, and the display apparatus may be products or components having display function, such as liquid display apparatus, liquid TV, digital frame, mobile phone or panel computer.

An embodiment of the present invention provides a display apparatus comprising an array substrate. The array substrate comprises display areas and non-display areas, wherein the non-display area comprises the areas in which a plurality rows of gate lines and a plurality columns of data lines crossed to each other are located and the areas in which thin film transistors are located, the gate lines and the data lines being formed by patterning metal film layers which are formed by magnetron sputtering targets spaced to each other; and wherein a pad part is formed in an area of the non-display areas corresponding to the spacing areas between the targets, a sum of thickness of the metal film layers formed in the areas corresponding to the spacing areas between the targets and the thickness of the pad part being equal to the thickness of the metal film layers formed in the areas facing the targets. In this way, the thickness of the film layer formed on the above metal film layers in contact with the spacers may become uniform such that each of the spacers on the array substrate can support the liquid crystal box in thickness. Thus, the balance of the box thickness may be maintained and the quality of products will be improved.

An embodiment of the present invention provides a method for producing an array substrate. As illustrated in FIG. 2, the array substrate comprises display areas 113 and non-display areas 123. The method comprises: magnetron sputtering targets 12 spaced to each other (as shown in FIG. 1) to form metal film layers and patterning the metal film layers to a plurality rows of gate lines 101 and a plurality columns of data lines 102 crossed to each other in the non-display area and forming thin film transistors 103. The method may further comprise:

forming a pad part 104 in an area of the non-display areas 123 corresponding to the spacing areas 120 between the targets 12, a sum of thickness of the metal film layers 10 formed in the areas corresponding to the spacing areas 120 between the targets 12 and the thickness of the pad part 104 being equal to the thickness of the metal film layer 10 formed in the areas corresponding to areas 121 facing the targets 12.

It should be noted that, in order to improve utilization ratio, the above targets 12 are typically arranged and spaced to each other. The metal film layers 10 are deposited on the transparent substrate 100 by the magnetron sputtering process. The thickness of the metal film layers 10 formed in the areas corresponding to the spacing areas 120 between the targets 12 is less than the thickness of the metal film layers 10 formed in the areas corresponding to areas 121 facing the targets. In this way, the resultant metal film layers 10 may be uneven such that the flatness of a surface of the film layer formed on the surface of the metal film layers 10 in contact with the spacers (not shown in Figs.) will be reduced. Thus, part of spacers on the array substrate will not have a function of supporting the liquid crystal box in thickness. With the above pad part 104 provided on the non-display areas, the thickness of the metal film layers 10 formed in the area corresponding to the spacing areas 120 between the targets 12 may be increased such that the sum of thickness of the metal film layers 10 formed in the areas corresponding to the spacing areas 120 between the targets 12 and the thickness of the pad part 104 is equal to the thickness of the metal film layers 10 formed in the areas corresponding to the areas 121 facing the targets 12. In this way, the thickness of the film layer formed on the surface of the metal film layers 10 in contact with the spacers become uniform.

An embodiment of the present invention provides a method for producing an array substrate, the array substrate comprising display areas and non-display areas, the method comprises: magnetron sputtering targets spaced to each other to form metal film layers and patterning the metal film layers to a plurality rows of gate lines and a plurality columns of data lines crossed to each other in the non-display area and forming thin film transistors, wherein the method further comprises: forming a pad part in an area of the non-display areas corresponding to the spacing areas between the targets, a sum of thickness of the metal film layers formed in the areas corresponding to the spacing areas between the targets and the thickness of the pad part being equal to the thickness of the metal film layer formed in the areas facing the targets. In this way, the thickness of the film layer formed on the above metal film layers in contact with the spacers may become uniform such that each of the spacers on the array substrate can support the liquid crystal box in thickness. Thus, the balance of the box thickness may be maintained and the quality of products will be improved.

Further, forming the metal film layers 10 may comprise depositing a gate insulation layer 200 on a transparent substrate 100.

It should be noted that there are various metal film layers 10 on the array substrate, for example, the gate metal layer 200 forming the gate lines 101 and a source and drain metal layer forming the source and drain of TFT 103. For the TN (twist nematic) type display apparatus in which a common electrode is provided on the color film substrate, the gate metal layer 200 which may be used as the first metal film layer on the array substrate is located on the surface of the transparent substrate 100. Thus, it needs to provide a pad part 104 on the surface of the gate metal layer 200 to increase the thickness of the gate metal layer 200 formed in the areas corresponding to the spacing areas 120 between the targets 12. It can achieve uniformity in thickness of the film layer formed on the surface of the gate metal layer 200 in contact with the spacers and may improve quality of the array substrate.

Further, the process of producing the pad part 104 may comprise:

forming a rising layer 201 by patterning the material which is same to that of a semiconductor active layer of the film transistor. The semiconductor active layer of TFT may be comprised of IGZO(indium gallium zinc oxide) in the same layer. In this way, the semiconductor active layer of TFT may be formed while the rising layer 201 is formed by a patterning process. Thus, the process of producing the pad part 104 comprising the rising layer 201 separately can be omitted such that the producing process may be simplified to improve the product efficiency.

Figure 6:
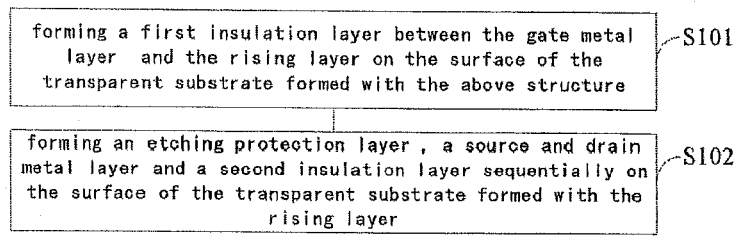
FIG. 6 is a flow chart of a method for producing an array substrate according to an exemplified embodiment of the present invention.

Further, as illustrated in FIG. 6, the process of producing the pad part may further comprise:

forming a first insulation layer 202 between the gate metal layer 200 and the rising layer 201 on the surface of the transparent substrate formed with the above structure by patterning S101;

forming an etching protection layer 203, a source and drain metal layer 204 and a second insulation layer 205 sequentially on the surface of the transparent substrate formed with the rising layer 201 by patterning S102.

The first insulation layer 202, the etching protection layer 203, the source and drain metal layer 204 and the second insulation layer 205 form a trapezoid stack.

The trapezoid stack means the stack comprised of a plurality of film layers with areas reduced progressively formed on the surface of the gate insulation layer 200, as shown in FIG. 3. The film layer (the first insulation layer 202) closest to the gate insulation layer 200 has a maximum area while the film layer (the second insulation layer 205) farthest from the gate insulation layer 200 has a minimum area. In this way, the pad part 104 formed with small upper portion and large lower portion, may improve the stability of supporting the liquid crystal box by the spacers when the pad part 104 contacts with the spacers.

In this way, besides the above rising layer 201, the pad part 104 further has other film layers for forming the array substrate. The thickness of the gate insulation layer 200 formed in the areas corresponding to the spacing areas 120 between the targets 12 is increased due to the above rising layer 201. Thus, the film layer formed in the areas corresponding to the spacing areas 120 between the targets 12 in contact with the spacers and the film layer formed in the areas corresponding to the areas 121 for facing the targets 12 in contact with the spacers have a substantially same thickness so as to improve the uniformity in thickness of the film layer at the interface between the spacers and the film layer. In this way, each of the spacers on the array substrate supports the liquid crystal box in thickness to keep the balance of box thickness to improve the quality of products.

Further, when the method for producing the array substrate according to the embodiments of the present invention is used in FSS(fringe field switching) type liquid crystal display, before depositing the gate insulation layer 200 on the transparent substrate 100, the process of producing the pad part further comprises: forming a first electrode layer 300 on the surface of the transparent substrate 100.

For the FFS type display apparatus in which the first electrode layer 300 and the second electrode layer 301 are both arranged on the array substrate, the gate metal layer 200 as the first one of the metal film layers on the array substrate is located on the surface of the first electrode layer 300. Thus, in order to keep uniformity in thickness of the film layer formed on the surface of the gate metal layer 200 in contact with the spacers, the first electrode layer 300 is formed on the surface of the transparent substrate 100 before depositing the gate insulation layer 200 on the transparent substrate 100. The pad part 104 comprises the first electrode layer 300 so as to increase the thickness of the gate metal layer 200 formed in the areas corresponding to the spacing areas 120 between the targets 12 to keep uniformity in thickness of the film layer formed on the surface of the gate metal layer 200 in contact with the spacers. It may further improve the quality of the array substrate.

FFS technology forms multi-dimensional electrical fields by parallel electrical fields produced by the edge of the pixel electrodes in one same plane and the longitudinal electrical field produced between the pixel electrode layer and the common electrode layer. In this way, all liquid crystal molecules with all of orientations among the pixel electrodes above the electrodes in the liquid crystal box may produce rotational conversion so as to improve the work efficiency of the liquid crystal with plane orientation and improve the light transmission efficiency.

In order to further improve the flatness of the film layer on the array substrate in contact with the spacers, the process of producing the pad part 104 further comprises:

forming a second electrode layer 301 on the surface of the transparent substrate formed with the second insulation layer 205 by patterning. In this way, within the non-display areas 123, at the position of the film metal layers formed in the areas corresponding to the spacing areas 120 between the targets 12, by means of the pad part 104 comprising the first electrode layer 300, the rising layer 203 and the second electrode layer 301, the sum of the thickness of the metal film layers formed in the areas corresponding to the spacing areas 120 between the targets 12 and the thickness of the pad part 104 may be made to be equal to the thickness of the metal film layers formed in the areas corresponding to the areas 121 facing the targets 12, so as to achieve uniformity in thickness of the film layer on the array substrate in contact with the spacers. In this way, each of the spacers on the array substrate supports the liquid crystal box in thickness to keep the balance of box thickness to improve the quality of products.

Although several exemplary embodiments have been shown and described, the present invention is not limited to those and it would be appreciated by those skilled in the art that various changes or modifications may be made in these embodiments without departing from the principles and spirit of the disclosure, which should fall within the scope of the present invention. The scope of the invention is defined in the claims and their equivalents.

What is claimed is:

1. A array substrate comprising display areas and non-display areas,
    wherein the non-display area comprises an area in which a plurality rows of gate lines and a plurality columns of data lines crossed to each other are located and an area in which thin film transistors are located,
    the gate lines and the data lines are formed by patterning metal film layers,
    wherein a pad part is formed at one end of the gate lines or data lines and the pad part comprises a trapezoid stack comprised of a first insulation layer, an etching protection layer, a source and drain metal layer and a second insulation layer formed sequentially from a surface of the metal film layers in the non-display areas.

2. The array substrate according to claim 1, wherein the metal film layers comprise a gate metal layer formed on a transparent substrate surface.

3. The array substrate according to claim 2, wherein the pad part comprises a rising layer, and wherein the material from which the rising layer is made is the same to the material of a semiconductor active layer of the film transistor.

4. The array substrate according to claim 1, wherein the pad part further comprises:
    a first electrode layer between the transparent substrate and the gate metal layer in the non-display areas.

5. The array substrate according to claim 4, wherein the pad part further comprises:
    a second electrode layer on a surface of the second insulation layer in the non-display areas.

6. The array substrate according to claim 5, wherein the first electrode layer is a common electrode and the second electrode layer is a pixel electrode; or
    wherein the first electrode layer is a pixel electrode and the second electrode layer is a common electrode.

7. A display apparatus comprising:
    the array substrate according to claim 1.

* * * * *